United States Patent [19]

Härle

[11] Patent Number: 5,808,425
[45] Date of Patent: Sep. 15, 1998

[54] METHOD FOR CONTROLLING THE EMISSION CURRENT OF AN ELECTRON SOURCE AND AN ELECTRON SOURCE HAVING A CONTROL CIRCUIT FOR CONTROLLING THE EMISSION CURRENT

[75] Inventor: Rainer Härle, Heidenheim, Germany

[73] Assignee: Carl-Zeiss-Stiftung, Heidenheim, Germany

[21] Appl. No.: 667,973

[22] Filed: Jun. 19, 1996

[30] Foreign Application Priority Data

Jun. 20, 1995 [DE] Germany ............... 195 22 221.0

[51] Int. Cl.⁶ ................................... H01J 29/52
[52] U.S. Cl. .................. 315/381; 315/106; 315/107
[58] Field of Search ............................ 315/381, 106, 315/107

[56] References Cited

U.S. PATENT DOCUMENTS

| | | |
|---|---|---|
| 4,454,453 | 6/1984 | Sugawara . |
| 4,525,652 | 6/1985 | Sperzel et al. . |
| 5,185,559 | 2/1993 | Shimoda et al. . |
| 5,357,172 | 10/1994 | Lee et al. . |

FOREIGN PATENT DOCUMENTS

| | | |
|---|---|---|
| 0159214 | 10/1985 | European Pat. Off. . |
| 59-040449 | 3/1984 | Japan . |
| 59-040450 | 3/1984 | Japan . |
| 653835 | 1/1986 | Switzerland . |
| 2081941 | 2/1982 | United Kingdom . |

OTHER PUBLICATIONS

"Simple dc technique for precise electron beam current regulation" by M. Debe et al, Review of Scientific Instruments, vol. 47, No. 1, Jan. 1976, pp. 37 to 38.

*Primary Examiner*—Theodore M. Blum
*Attorney, Agent, or Firm*—Walter Ottesen

[57] ABSTRACT

The invention is directed to a method for controlling the emission current of an electron source and to a correspondingly controlled electron source. For this purpose, a parallel circuit comprising resistors 6 and field-effect transistors 7 is connected in the high-voltage circuit between the cathode 1 and the control electrode 2. The supply voltage for the field-effect transistors 7 is generated by voltage dividing the voltage across the resistors 6. The measurement of the emission current takes place at low-voltage potential and a control signal obtained from the measuring signal is optically transmitted via a light-conducting fiber or a light waveguide to the control circuit in the high-voltage part. The emission current control at high-voltage potential is provided without additional voltage supplies. Additional insulating transformers are therefore not required.

19 Claims, 2 Drawing Sheets

METHOD FOR CONTROLLING THE EMISSION CURRENT OF AN ELECTRON SOURCE AND AN ELECTRON SOURCE HAVING A CONTROL CIRCUIT FOR CONTROLLING THE EMISSION CURRENT

BACKGROUND OF THE INVENTION

The electron sources utilized in electron microscopes include, as a rule, a triode arrangement. Such a triode arrangement comprises three electrodes: a cathode emitting electrons, a control electrode for controlling the electron current and an anode. The emitted electrons are accelerated toward the anode. As a rule, a high-voltage potential of 10 to 30 kV in raster microscopes and 80 to 300 kV in transmission electron microscopes is applied to the cathode and the control electrode. The control electrode controls the electron current independently of the acceleration voltage across the cathode and anode and independently of the heating current of the cathode. The cathode and control electrode are usually at a high negative potential and the anode is at ground potential so that the specimen to be investigated in the electron microscope is likewise at ground potential. The potential of the control electrode is, in magnitude, somewhat greater than the potential of the cathode. The cathode and the control electrode are therefore connected to the negative high-voltage output of the high-voltage source.

Providing a controllable resistor in the high-voltage loop between the control electrode and the cathode is one possibility for controlling the emission current. The electron current emitted by the cathode taken additively with the feedback current through a feedback resistor of the high-voltage control produces a voltage drop across this control resistor. The voltage difference between the cathode and the control electrode is generated by this voltage drop analogous to a voltage divider circuit. The emission current can be varied by changing the resistance. In order to compare the emission current to a pregiven desired value, it is already known to measure the emission current on the low-voltage end of the high-voltage source via a measuring resistance and to compare the same to a desired value. Such an emission control is, for example, known from the electron microscope having the designation "JEM-1200 EX" of the JEOL company.

It is a disadvantage of this arrangement that the control signal generated at low-voltage potential must be transmitted to the variable resistance at high-voltage potential. This requires high-voltage isolation between the drive motor for the controllable resistance and the controllable resistance itself. Very long isolation paths are required, especially at high voltages above 100 kV, and these isolation paths oppose a compact structural configuration of the electron source.

Transistor circuits for controlling the emission current are disclosed in U.S. Pat. No. 5,185,559 and in European patent publication 0,159,214. The measurement of emission current takes place at the high-voltage potential and additional controllable voltage sources at high-voltage potential are required for generating the voltage difference between the control electrode and the cathode. So-called isolation transformers are required to provide the power supply of these sources. The insulating transformers are very complex at high voltages above 100 kV. These arrangements also have the problem that the reference input variable, which is applied for the comparison of the actual emission current to a desired emission current, must be transmitted in the form of a low-voltage potential to the control circuit which is at the high-voltage potential. For this purpose, a suggestion is made in the above-mentioned European patent publication, that a part of the control circuit is provided at the low-voltage end of the high-voltage source and the signals of this control circuit are conducted optically via glass fibers to the high-voltage end control circuit. However, this arrangement also requires insulating transformers for generating the grating voltage.

U.S. Pat. No. 5,357,172, furthermore discloses the control of the emission current in a field-emission display via field-effect transistors at low-voltage potential. Here, very low voltages of below 100 volts are utilized and the control of the emission current takes place via a change of the potential difference between the cathode and the anode. Such controls are, however, not considered for applications wherein a defined electron energy is desired, such as in electron microscopy.

SUMMARY OF THE INVENTION

It is an object of the invention to provide a method for controlling the emission current of an electron source at high-voltage potential. It is another object of the invention to provide such a method which requires only insignificant electronic and mechanical complexity and which allows for a compact structure of the electron source with a corresponding emission current control. It is a further object of the invention to provide an electron source having a correspondingly simple emission current control.

The method of the invention is for controlling the emission current of an electron source at high-voltage potential which includes a cathode and a control electrode, The method includes the steps of: providing a control apparatus at high-voltage potential connected to the cathode and control electrode; generating a measurement signal for the emission current at low-voltage potential; generating a control signal at low-voltage potential from the measurement signal; and, optically transmitting the control signal to the control apparatus at high-voltage potential thereby controlling the emission current.

In the method of the invention, a measuring signal for the emission current is generated at the low-voltage end of the high-voltage source and a control signal, which is generated based on the measuring signal, is supplied optically to an electronic control circuit at high-voltage potential. The optical feed of the control signal can take place via an optical fiber or a waveguide.

An electron source according to the invention correspondingly includes an electron-emitting cathode, a control electrode, an anode and a high-voltage source between the cathode and the anode. The electronic control circuit for the electron current is provided in the high-voltage circuit of the high-voltage source and a circuit is provided in the low-voltage circuit of the high-voltage source for measuring the electron current and for generating a control signal from this measured signal. The transmission of the control signal from the low-voltage circuit to the high-voltage circuit takes place optically via an electrically isolating waveguide or an electrically isolating optical fiber.

The measurement of the electron current takes place at low-voltage potential. For this reason, a comparison of the measuring signal to a reference input variable defining a desired value is possible without any need for complex insulating measures.

The electronic control circuit in the high-voltage circuit is advantageously configured by a parallel circuit of transistors or field-effect transistors and resistors. The parallel circuit is connected between the cathode and the control electrode. In this way, the potential difference between the cathode and the control electrode is generated with a control resistance in the manner of a voltage divider circuit as in the state of the art referred to initially herein. For this reason, no additional voltage sources, whose power supply is transformed via insulating transformers to high-voltage potential, are required for generating the potential difference between the control electrode and the cathode. All active electronic components (that is, the transistors or field-effect transistors) are arranged within the high-voltage circuit and no additional voltage sources are required for their supply. For these reasons, the entire arrangement exhibits high operational reliability, even in the case of high-voltage flashovers.

The selection between conventional transistors and field-effect transistors is dependent upon the magnitude of the emission current. For high emission currents, conventional semiconductor transistors can be utilized; whereas, for the low emission currents in electron microscopes of less than 1 mA, field-effect transistors are preferred because of their low power consumption.

In an advantageous embodiment, the circuit, which generates the control signal, includes a luminescent diode and the electronic control circuit includes a photodiode or a phototransistor in the base circuit of the transistors or in the gate circuit of the field-effect transistors. The light emitted by the luminescent diode is then coupled into the optical fiber or the waveguide. The light coupled out of the optical fiber or the waveguide controls via the photodiode or the phototransistor the voltage in the base circuit of the transistors or in the gate circuit of the field-effect transistors whereby the transistors or field-effect transistors become more or less conductive and, correspondingly, the voltage drop in the collector-emitter circuit of the transistors or the voltage drop in the drain-source circuit of the field-effect transistors is varied.

To measure the electron current, a simple measuring resistor can be provided between the high-voltage source and the anode. The voltage drop across the measuring resistor is determined by means of a measuring amplifier.

It has been shown advantageous to provide several parallel circuits of transistors or field-effect transistors and resistors in series between the cathode and the anode in dependence upon how large, as a maximum, the potential difference between the cathode and the control electrode is intended to be and how large the corresponding control range for the electron current is.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
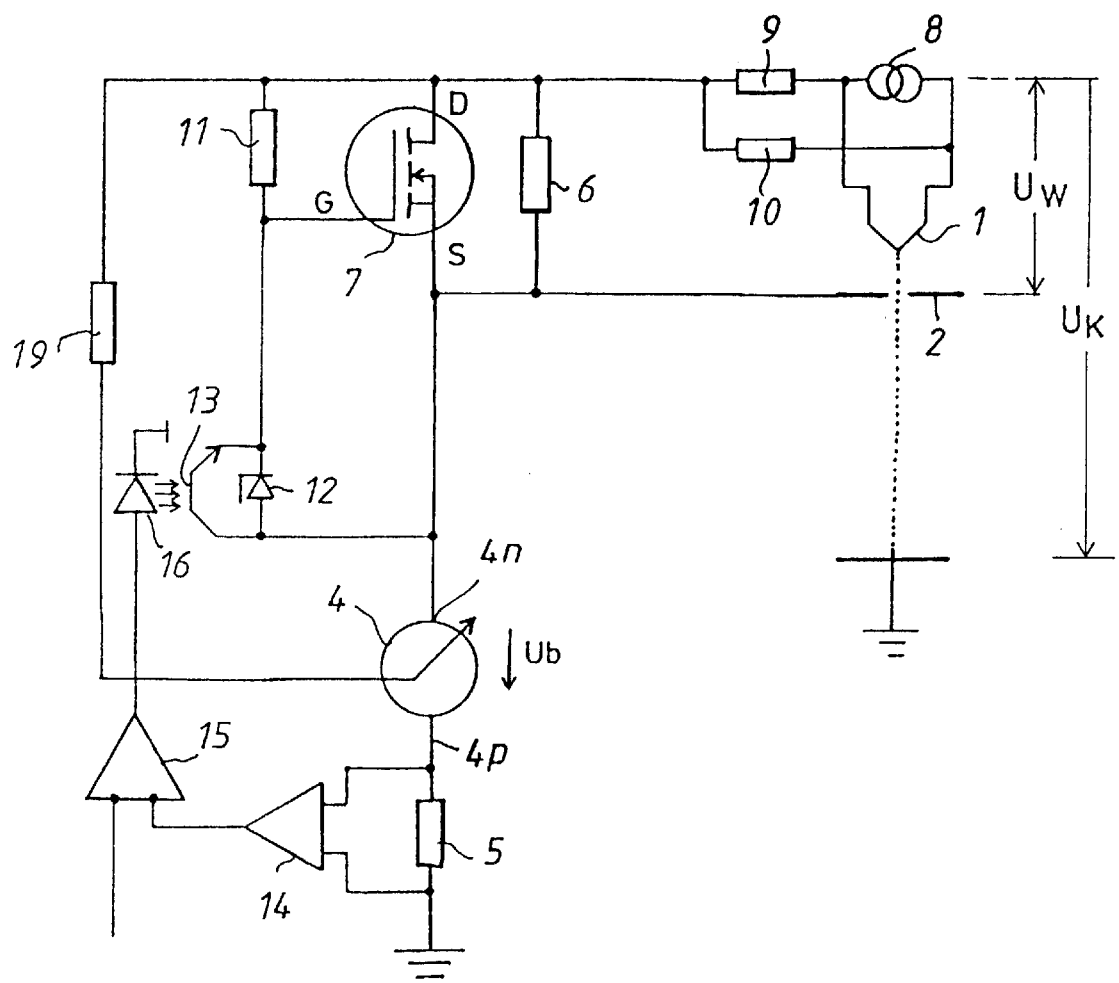
FIG. 1 is a schematic of a circuit of a first simple embodiment of the invention; and, FIG. 2 is a schematic of a circuit of a second embodiment of the invention for generating larger potential differences between the anode and the cathode.

The embodiment of FIG. 1 includes an electron-emitting cathode 1, the control electrode (Wehnelt electrode) 2 and the anode 3. The anode 3 is at ground potential as is conventional for electron sources in electron microscopes. The cathode 1 and the control or Wehnelt electrode 2 are connected to the negative pole 4n of a controllable high-voltage source 4. The positive pole 4p of the high-voltage source 4 is either connected via a resistor 5 to ground potential or is connected via a resistor 5 with a direct line to the anode 3.

The cathode 1 is also connected via a feedback resistor 19 to the control of the high-voltage source 4. In this way, the cathode potential $U_K$ is controlled to a constant value.

The Wehnelt electrode 2 is connected without a series resistor to the negative pole 4n of the high-voltage source 4; whereas, the cathode 1 is connected via a parallel circuit to the negative pole 4n of the voltage source 4. The parallel circuit includes a resistor 6 and the drain-source circuit of a field-effect transistor 7.

In the embodiment shown, the work function of the cathode is reduced by heating the cathode. Accordingly, this is a thermal emission or a thermal field emission. For heating the cathode 1, a heater voltage is superposed on the high voltage via an insulating transformer 8. The fluctuations of the heater voltage are attenuated by the symmetrical resistors 9 and 10 in such a manner that such fluctuations have no influence on the cathode potential $U_K$.

This insulating transformer 8 is required only in the case of a thermal electron source or a thermal field-emission source. In addition to this insulating transformer 8, the control of the emission current in accordance with FIG. 1 does not require any additional voltage sources. This is so because all terminals of the field-effect transistor 7 are connected to the high-voltage circuit without voltage sources being connected therebetween. The drain terminal of the field-effect transistor 7 is connected directly to the cathode potential $U_K$ and the source terminal of the field-effect transistor 7 is connected directly to the potential of the Wehnelt electrode 2 which corresponds to the output voltage $U_b$ of the high-voltage source 4. The gate terminal of the field-effect transistor 7 is likewise in the high-voltage circuit and is connected into a voltage divider circuit comprising a resistor 11 and a phototransistor 13 which, likewise, is connected between the cathode 1 and the Wehnelt electrode 2. A Zener diode 12 is connected in the blocking direction and in parallel to the phototransistor 13. The Zener diode 12 protects the phototransistor 13.

To measure the emission current, the voltage is tapped forward of and rearward of the measuring resistor 5 and is supplied to the two inputs of the measuring amplifier 14. This voltage drops across the measuring resistor 5 between the positive pole 4p of the voltage source 4 and the ground connection. The output of the measuring amplifier 14 is then supplied to an input of a series-connected controller 15. A reference input variable corresponding to a desired current is supplied to the second input of the controller 15. This reference input variable from the controller 15 is compared to the output of the measuring amplifier 14. A luminescent diode 16 is connected to the output of the controller 15 and emits a light signal corresponding to the difference between the reference input variable and the output of the measuring amplifier 14. This light signal is supplied to the light-sensitive surface of the phototransistor 13. The luminescent diode 16 emits more or less light depending upon how greatly the emission current deviates from the desired value and therefore how closely the output signal of the measuring amplifier 14 corresponds to the preadjusted reference input variable. Accordingly, the phototransistor 13 in the high-voltage circuit is more or less conductive whereby, in turn, the field-effect transistor 7 is made more or less conductive because of the voltage divider circuit comprising resistor 11 and phototransistor 13 in the gate circuit of the field-effect transistor 7. Accordingly, and depending upon the remaining magnitude of the resistance of the field-effect transistor 7, the potential difference $U_W$ between the cathode 1 and the Wehnelt electrode 2 changes.

In the embodiment of FIG. 1, the maximum obtainable potential difference between the cathode 1 and the Wehnelt electrode 2 is limited by the breakdown voltage of the field-effect transistor 7 and is approximately 1 kV. This potential difference is, for example, obtained for a high voltage $U_K$ of −120 kV, a resistance 11 of 120 MOhm in the gate circuit and a resistance 6 of 20 MOhm in parallel with the field-effect transistor 7. If higher potential differences between the cathode 1 and the Wehnelt electrode 2 are required, then several parallel circuits of resistors 6 and transistors 7 can be connected in series, one behind the other, between the cathode 1 and the Wehnelt electrode 2.

Figure 2:
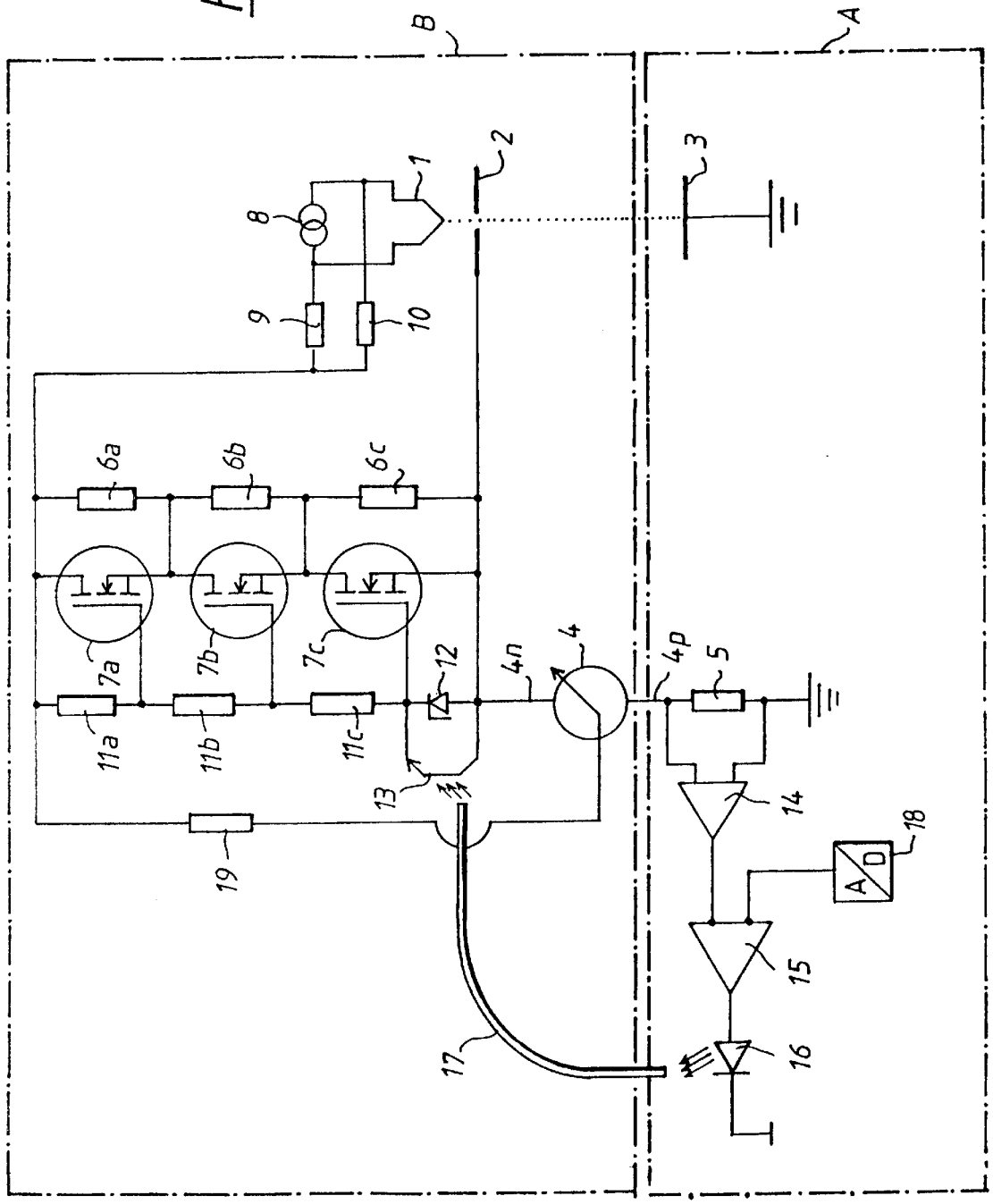

The embodiment of FIG. 2 is very similar to the embodiment of FIG. 1. Accordingly, identical elements in FIG. 2 are provided with the same reference numerals as in FIG. 1.

A significant difference to the embodiment of FIG. 1 is that, in the embodiment of FIG. 2, three identical resistors (6a, 6b, 6c) are connected in series between the cathode 1 and the Wehnelt electrode 2. In addition, three identical field-effect transistors (7a, 7b, 7c) are connected in parallel with the three resistors (6a, 6b, 6c) with the field-effect transistors also being connected in series one behind the other as shown. For each field-effect transistor, the drain terminal thereof is connected to the source terminal of the other field-effect transistor. In addition, three identical resistors (11a, 11b, 11c) are provided as voltage dividers in the respective gate circuits of the field-effect transistors (7a, 7b, 7c). Thus, three circuit arrangements are connected in series, one behind the other, with each circuit arrangement comprising a source-drain resistor 6, a field-effect transistor 7 and a gate-drain resistor 11 from FIG. 1. In this way, the circuit arrangement of FIG. 2 permits a potential difference to be generated between the cathode 1 and the Wehnelt electrode 2 which is three times higher. If still higher potential differences are required, then additional parallel circuits of resistors (6, 11) and field-effect transistors 7 can be connected in series, one behind the other.

In FIG. 2, for clarity, the high-voltage part B and the low-voltage part A are delimited by blocks shown with dash-dot lines.

The low-voltage part A is essentially at ground potential. The only electrical connections between the low-voltage part A and the high-voltage part B are the high-voltage source 4 and the acceleration path for the electrons between the Wehnelt electrode 2 and the anode 3. The control signals for the emission current which are generated with respect to high voltage to ground potential are supplied optically to the high-voltage part B via an electrically isolating optical fiber 17 or an electrically insulating waveguide. The optical fiber 17 thereby functions as an isolator between the low-voltage part A and the high-voltage part B. The reference input variable for the emission current is supplied via an interface (not shown) from the control computer via an analog-to-digital converter 18 in the low-voltage part A.

An essential advantage of the emission current control according to the invention is that the electronic components, as well as the glass fiber 17, are mass produced products and that neither insulated controllers nor insulating transformers are required. In this way, the control electronics can be arranged without difficulty, also in the case of high voltages above 100 kV, on two small printed circuit boards, of which one is arranged in the high-voltage part of the electron source and the second is arranged in the low-voltage part of the electron source. In this way, the invention permits a compact configuration to be realized even in the case of high high-voltages. As a further advantage, only the number of parallel connected field-effect transistors 7 and resistors (6, 11) must be adapted to the required Wehnelt voltage in the case of different required potential differences between the cathode and the Wehnelt electrode.

It is understood that the foregoing description is that of the preferred embodiments of the invention and that various changes and modifications may be made thereto without departing from the spirit and scope of the invention as defined in the appended claims.

What is claimed is:

1. An electron source comprising:

an anode;

an electron emitting cathode from which an electron current can flow to said anode;

a control electrode disposed between said cathode and said anode;

a high-voltage source connected between said cathode and said anode;

an electronic control circuit for controlling said electron current;

a first circuit at high-voltage potential incorporating said electronic control circuit;

a second circuit at low-voltage potential for measuring said electron current and utilizing the measurement to generate an optical control signal;

an optical transmitting device for optically transmitting said optical control signal to said electronic control circuit;

said electronic control circuit including a parallel circuit connected between said cathode and said control electrode; and, said parallel circuit including a transistor and a resistor mutually connected in parallel; and, said transistor having a plurality of terminals connected into said first circuit without an additional voltage source connected therebetween.

2. The electron source of claim 1, wherein said transistor is a field-effect transistor.

3. An electron source comprising:

an electron emitting cathode;

a control electrode for controlling the emission current of said cathode;

an anode;

a high-voltage source connected between said anode and said cathode;

a first circuit at high potential including:

a control circuit including plurality of series connected field-effect transistors and a plurality of series connected resistors connected between said cathode and said control electrode to permit said field-effect transistors to control a potential difference between said control electrode and said cathode;

a measuring resistor for measuring said emission current and said measuring resistor being connected between said high-voltage source and said anode;

a controller for comparing the measured emission current to a reference variable to generate a control signal;

a light emitting element connected to the output of said controller for outputting said control signal as an optical control signal;

a light-sensitive element connected into the gate circuit of at least one of said field-effect transistors;

a light-transmitting element for transmitting said optical control signal to said light-sensitive element; and, said series-connected field-effect transistors and said series-connected resistors causing the potential difference between said cathode and said control electrode to be divided to exclusively define the respective voltages of said field-effect transistors with said potential difference being produced by the emission current.

4. An electron source comprising:

an anode;

an electron emitting cathode from which an electron current can flow to said anode;

a control electrode disposed between said cathode and said anode;

a high-voltage source connected between said cathode and said anode;

an electronic control circuit for controlling said electron current;

a first circuit at high-voltage potential incorporating said electronic control circuit;

a second circuit at low-voltage potential for measuring said electron current and utilizing the measurement to generate an optical control signal;

an optical transmitting device for optically transmitting said optical control signal to said electronic control circuit;

said electronic control circuit including a parallel circuit connected between said cathode and said control electrode; and, said parallel circuit including a transistor and a resistor mutually connected in parallel; and, the control circuit controlling a potential difference between said cathode and said control electrode generated by said emission current and wherein the control circuit is supplied by supply voltages which are exclusively generated by a voltage division of the potential difference between said cathode and said control electrode.

5. The electron source of claim 4, said transistor being a field-effect transistor.

6. The electron source of claim 4, said electronic control circuit including a plurality of said parallel circuits connected in series between said cathode and said control electrode.

7. The electron source of claim 4, said optical transmitting device being an optical fiber or a light waveguide.

8. The electron source of claim 4, said second circuit including a light source for emitting said optical control signal; said transistor having a gate circuit and said electronic control circuit further including a light detector for receiving said optical control signal; and, said light detector being connected into said gate circuit.

9. The electron source of claim 8, said light detector being a photodiode or phototransistor.

10. The electron source of claim 4, said second circuit further including a measuring resistor for measuring said emission current; and, said measuring resistor being connected between said high-voltage source and said anode.

11. The electron source of claim 6, said plurality of said parallel circuits defining a voltage divider dividing the potential difference between said cathode and said control electrode for exclusively supplying said electronic control circuit with a supply voltage.

12. The electron source of claim 4, said second circuit further including a measuring resistor for measuring said emission current; and, said measuring resistor being connected between said high-voltage source and said anode.

13. An electron source comprising:

an anode;

an electron emitting cathode from which an electron current can flow to said anode;

a control electrode disposed between said cathode and said anode;

a high-voltage source connected between said cathode and said anode;

an electronic control circuit for controlling said electron current;

a first circuit at high-voltage potential incorporating said electronic control circuit;

a second circuit at low-voltage potential for measuring said electron current and utilizing the measurement to generate an optical control signal;

an optical transmitting device for optically transmitting said optical control signal to said electronic control circuit; and, said electronic control circuit including a parallel circuit connected between said cathode and said control electrode; and, said parallel circuit including a field-effect transistor and a resistor mutually connected in parallel.

14. The electron source of claim 13, said electronic control circuit including a plurality of said parallel circuits connected in series between said cathode and said control electrode.

15. The electron source of claim 13, said optical transmitting device being an optical fiber or a light waveguide.

16. The electron source of claim 13, said second circuit including a light source for emitting said optical control signal; said transistor having a gate circuit and said electronic control circuit further including a light detector for receiving said optical control signal; and, said light detector being connected into said gate circuit.

17. The electron source of claim 16, said light detector being a photodiode or phototransistor.

18. The electron source of claim 14, said plurality of said parallel circuits defining a voltage divider dividing the potential difference between said cathode and said control electrode for exclusively supplying said electronic control circuit with a supply voltage.

19. The electron source of claim 13, the control circuit controlling a potential difference between said cathode and said control electrode generated by said emission current and wherein the control circuit is supplied by supply voltages which are exclusively generated by a voltage division of the potential difference between said cathode and said control electrode.

* * * * *